(12) United States Patent
Peterson et al.

(10) Patent No.: US 9,698,782 B1
(45) Date of Patent: Jul. 4, 2017

(54) SYSTEMS AND METHODS TO PROVIDE CHARGE SHARING AT A TRANSMIT BUFFER CIRCUIT

(71) Applicant: QUALCOMM Incorporated, San Diego, CA (US)

(72) Inventors: Luverne Ray Peterson, San Diego, CA (US); Thomas Bryan, Carlsbad, CA (US); Stephen Thilenius, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/098,129

(22) Filed: Apr. 13, 2016

(51) Int. Cl.
| H03K 3/00 | (2006.01) |
| H03K 19/003 | (2006.01) |
| H03K 17/16 | (2006.01) |
| H03K 19/00 | (2006.01) |

(52) U.S. Cl.
CPC ..... *H03K 19/00361* (2013.01); *H03K 17/162* (2013.01); *H03K 19/0013* (2013.01)

(58) Field of Classification Search
None
See application file for complete search history.

(56) References Cited

U.S. PATENT DOCUMENTS

| 4,798,972 | A | 1/1989 | Melanson et al. |
| 5,949,259 | A | 9/1999 | Garcia |
| 7,586,331 | B2 | 9/2009 | La Placa et al. |
| 7,724,026 | B1 | 5/2010 | Tan |
| 8,461,880 | B2 | 6/2013 | Tran |
| 9,360,881 | B2 * | 6/2016 | Tokuda ......... H03K 19/017509 |
| 9,424,894 | B2 * | 8/2016 | Kim ................ G11C 7/1084 |
| 9,450,581 | B2 * | 9/2016 | Tamura ............ H03K 19/0013 |
| 9,461,646 | B2 * | 10/2016 | Kozuma ........... H03K 19/0013 |
| 9,473,134 | B2 * | 10/2016 | Vashishtha .......... H03K 17/687 |

* cited by examiner

*Primary Examiner* — Lincoln Donovan
*Assistant Examiner* — Khareem E Almo
(74) *Attorney, Agent, or Firm* — Haynes and Boone, LLP

(57) ABSTRACT

A circuit includes a data input in communication with a first transistor stack; a first capacitor having a first capacitance and in communication with a power supply via a first transistor of the first transistor stack, wherein the first transistor is configured to charge the first capacitor in response to the data input receiving a signal corresponding to a first binary value; a data output node coupled between the first transistor stack and a transmission line having a second capacitance; and wherein the first capacitor is coupled between the data output node and a second transistor of the first transistor stack, further wherein the second transistor is configured to discharge the first capacitor to the data output node in response to the data input receiving a signal corresponding to a second binary value.

30 Claims, 6 Drawing Sheets

SYSTEMS AND METHODS TO PROVIDE CHARGE SHARING AT A TRANSMIT BUFFER CIRCUIT

TECHNICAL FIELD

This application relates to transmit buffer circuits and, more specifically, to transmit buffer circuits including charge sharing.

BACKGROUND

Some conventional computing systems include multiple chips that communicate to each other over data transmission lines. Focusing on one data line, on one side of the data line there is a transmit data buffer, and on the other side of the data line is a receive data buffer. The transmit data buffer may receive data from a flip-flop and then transmit the data over the transmission line, and the receive data buffer may then capture the data from the transmission line using a comparator and a flip-flop. The transmit data buffers, the receive data buffers, and the data transmission lines spanning from one chip to the other are often referred to as a die-to-die interface.

Continuing with the example, some transmit data buffers transmit the data at a same voltage swing as its power supply (VDD). For example, if a power supply provides 1.5 V to the transmit data buffer, then the transmit data buffer may output bits using 1.5 V for a binary one and 0 V for a binary zero, thereby using the full 1.5 V swing. Using a larger voltage swing may in some systems provide for a high signal integrity at the die-to-die interface.

As chips are often deployed in mobile devices, power savings has become a focus of interest. For example, strategies such as power collapsing cores during an idle time and/or gating a clock to idle components are conventional techniques to reduce wasted power in computing chips. Die-to-die interfaces also consume power; therefore it would be desirable to save power at die-to-die interfaces when possible while providing high signal integrity.

SUMMARY

Various embodiments include systems and methods that save power at die-to-die interfaces by using a capacitive charge sharing. Embodiments include using charge sharing to provide a fixed output charge to the transmission line. When a signal corresponding to a binary zero is received by a transmit data buffer, the transmit data buffer charges a capacitor. When a subsequent signal corresponding to a binary one is received by the transmit data buffer, the transmit data buffer discharges the capacitor onto the transmission line. The transmission line has an associated capacitance that receives some of the charge from the capacitor. The binary one signal on the transmission channel is at a lower voltage than the power supply voltage, thereby conserving some amount of power.

In one embodiment, a circuit includes a data input in communication with a first transistor stack; a first capacitor having a first capacitance and in communication with a power supply via a first transistor of the first transistor stack, wherein the first transistor is configured to charge the first capacitor in response to the data input receiving a signal corresponding to a first binary value; a data output node coupled between the first transistor stack and a transmission line having a second capacitance; and wherein the first capacitor is coupled between the data output node and a second transistor of the first transistor stack, further wherein the second transistor is configured to discharge the first capacitor to the data output node in response to the data input receiving a signal corresponding to a second binary value.

In another embodiment, a method to output a data signal, the method including: receiving a signal corresponding to a binary zero, and in response to the signal corresponding to the binary zero turning on a pulldown transistor for a data output node and turning on a first transistor coupled between a power supply voltage and a capacitor; charging the capacitor to the power supply voltage as the first transistor is on; receiving a signal corresponding to a binary one, and in response to the signal corresponding to the binary one turning off the pulldown transistor and the first transistor and turning on a second transistor coupled between the capacitor and a data output node; and asserting the binary one at the data output node by charge sharing between the capacitor and a capacitance of a data line coupled with the data output node.

In another embodiment, a data transmitting circuit includes means for coupling a data output node to ground in response to receiving a signal corresponding to a binary zero as a data input; means for charging a first capacitor to a power supply voltage in response to receiving the signal corresponding to the binary zero as the data input; and means for discharging the first capacitor at the data output node to achieve a voltage output high at the data output node in response to receiving a signal corresponding to a binary one as the data input, wherein the voltage output high is higher than ground and lower than the power supply voltage.

In yet another embodiment, a processing chip includes a plurality of data transmitting circuits, each of the data transmitting circuits in communication with a respective data transmission line, each of the data transmission lines having a respective capacitance; each of the transmitting circuits comprising: a first transistor stack configured to couple the data output node to ground in response to receiving a signal corresponding to a binary zero as a data input, further configured to charge a first capacitor to a power supply voltage in response to receiving the signal corresponding to the binary zero as the data input, and further configured to discharge the first capacitor at the data output node to a voltage output high that is lower than the power supply voltage in response to receiving a signal corresponding to a binary one as the data input; and a second transistor stack configured to couple the data output node to ground in response to receiving the signal corresponding to the binary zero as the data input, further configured to charge a second capacitor to the power supply voltage in response to receiving the signal corresponding to the binary zero as the data input, and further configured for discharging the second capacitor at the data output node to the voltage output high in response to receiving the signal corresponding to the binary one as the data input; wherein the first transistor stack and second transistor stack are configured to be selected or deselected using respective enable signals.

DETAILED DESCRIPTION

Various embodiments provide for systems and methods to use charge sharing at a transmit buffer circuit. One example embodiments include a stack of transistors between a power rail (VDD) and ground (VSS). A first one of the transistors couples a capacitor to the power rail, and a second one of the transistors couples the capacitor to a data output node. When the buffer circuit receives an input signal corresponding to a binary one, it turns off the first transistor and turns on the second transistor, thereby discharging the capacitor onto the transmission line via the data output node. When the buffer circuit receives an input signal corresponding to a binary zero, it turns on the first transistor and turns off the second transistor, thereby charging the capacitor while the data output node is held at a low voltage.

The data transmission line includes a capacitance (C2), which in this example is a parasitic capacitance. The capacitance value (C1) of the capacitor of the transmit buffer circuit is selected with Equation 1 in mind, where VOH is a voltage output high value for the data output node, and VOH is less than the full value of VDD:

$$VOH = Vdd*(C1/(C1+C2)).\qquad\text{Equation 1}$$

Continuing with the example, the transmit buffer circuit includes multiple circuits in parallel having the stack of transistors and capacitor. The circuits are selectable, and their capacitance values are added to C1 when multiple ones of the circuits are selected (e.g., enabled) together. In other words, the value of C1 may be tuned by selectively turning some of the circuits on or some of the circuits off. In one example, the tuning is performed during manufacture so that the value of C1 can be matched to a value of C2, thereby providing a desired value for VOH even in light of process variation.

Of course, some die-to-die interfaces according to embodiments may include multiple data channels, and the structure described herein may be implemented at each one of those data channels so that each bit is transferred from chip to chip having a voltage swing set at VOH.

Some embodiments may further include a diode coupled between the capacitor and the power rail, where a voltage drop across the diode is approximately equal to the difference between VDD and VOH. The diode is configured to charge the capacitor when the data output node is high and charge dissipation has brought the voltage below VOH. Once the voltage drops below VOH, current flows from the power rail to the capacitor, thereby charging the capacitor.

Various embodiments provide one or more advantages over conventional systems. For example, some embodiments may allow for data transmission at the die-to-die interface to have a voltage swing equal to VOH, which is set to be less than VDD. Reduction of the voltage swing may therefore reduce power use at the die-to-die interface, thereby extending battery life of a device.

Figure 1:
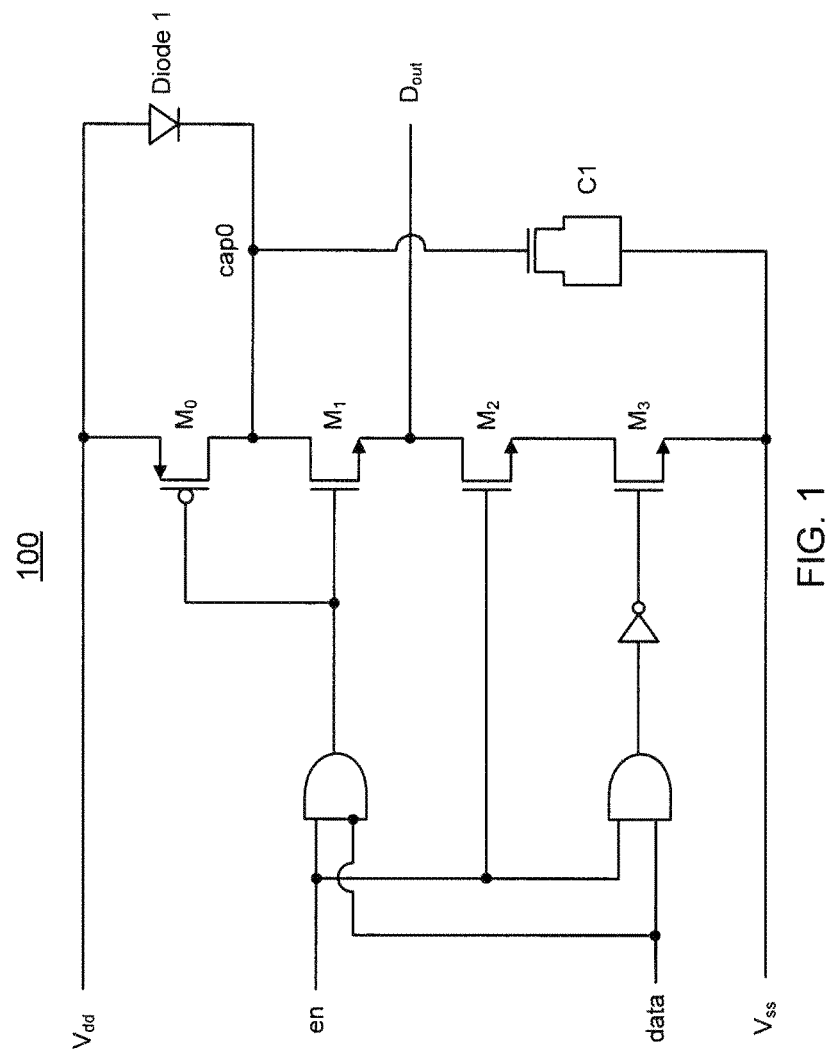
FIG. 1 is an illustration of an example data transmit buffer circuit according to one embodiment.

FIG. 1 is a simplified diagram illustrating an example transmit buffer circuit 100 in which various embodiments may be implemented. For purposes of the example of FIG. 1, the enable signal ("en") stays high, and transistor M2 stays on. When the enable signal is de-asserted, it turns off the transmit buffer circuit 100. Similarly, when the enable signal is high, the transmit buffer circuit 100 stays on during operation. In other words, transistor M2 acts as an enable circuit. A particular bit of a die-to-die interface may include multiple circuits similar to transmit buffer circuit 100 arranged in parallel and coupled to the same data output node and individually selectable using an enable circuit, as explained in further detail below with respect to FIG. 4.

The input data signal ("data") is a series of high and low voltages, and the circuit of FIG. 1 outputs the data at the data output node Dout at a value that swings between ground (Vss in this example) and VOH. The level of VOH depends upon a ratio of the value of capacitor C1 and the capacitance of the data line, which in this example will be referred to as C2. The ratio is given by Equation 1 above. Therefore, the voltage swing of the output data signal Dout is less than Vdd, thereby saving power. Although not shown in FIG. 1, Dout is provided to a data pad which is coupled to the data line.

Continuing with the example, an input signal corresponding to a binary zero is received as the input data signal. Transistor M3 turns on, thereby pulling Dout to zero. Transistor M0 is on and transistor M1 is off, thereby charging capacitor C1 up to Vdd. In other words, as the circuit of FIG. 2 outputs a signal corresponding to a binary zero, it charges the capacitor C1. Further in this example, a signal corresponding to a binary one is subsequently received, thereby turning M0 off, M1 on, and M3 off. This allows capacitor C1 to discharge via M1 to Dout, where it shares charge with the data transmission line capacitance C2. As long as the data transmission line capacitance C2 is non-zero, VOH will be less than Vdd.

If a signal corresponding to a binary zero value is received subsequently to the binary one, M0 turns on, M1 turns off and M3 turns on. However, if another signal corresponding to a binary one is received immediately subsequently to the binary one, the transistors should keep their current states of on or off. If there is current leakage at the data transmission line, then the data line may discharge capacitor C1. In this example, diode 1 is provided to hold Dout at VOH in the event of leakage on the data line. Specifically, diode 1 is selected to have a voltage drop that is approximately equal to the difference between Vdd and VOH so that it turns on if the voltage at the node cap0 drops below VOH. Such feature may allow data transmit buffer 100 to transmit multiple binary one signals in a row without a significant dip in voltage.

Capacitor C1 in this example is shown as a transistor having its source and drain tied together and coupled to ground. This can be accomplished in some embodiments by building the transistor as an N-type transistor. Of course, capacitor C1 may be implemented in any appropriate manner.

Furthermore, in some examples, it may be desirable that transistors M0 and M1 are chosen with appropriate sizes. Specifically, it may be desirable that M1 is chosen as a low impedance transistor so that it discharges capacitor C1 relatively quickly, such as in less than a quarter clock period, when it turns on. Therefore, the drive strength of M1 may be chosen based on a desired edge rate for Dout. On the other hand, the drive strength of M0 may be chosen to provide an RC constant to charge capacitor C1 over approximately one-half bit period corresponding to the data low out time. Such constraint also leads to using a larger M0 for a faster clock This allows capacitor C1 to be charged gradually, thereby putting less demand on the power rail. Thus, in some embodiments, M1 may have a drive strength that is greater than the drive strength of M0. Any ratio of drive strength or size of M1 to M0 that satisfies these design concerns may be used in various embodiments. For instance, one example includes M1 having ten times the drive strength of M0 to satisfy the design concerns noted above.

Figure 2:
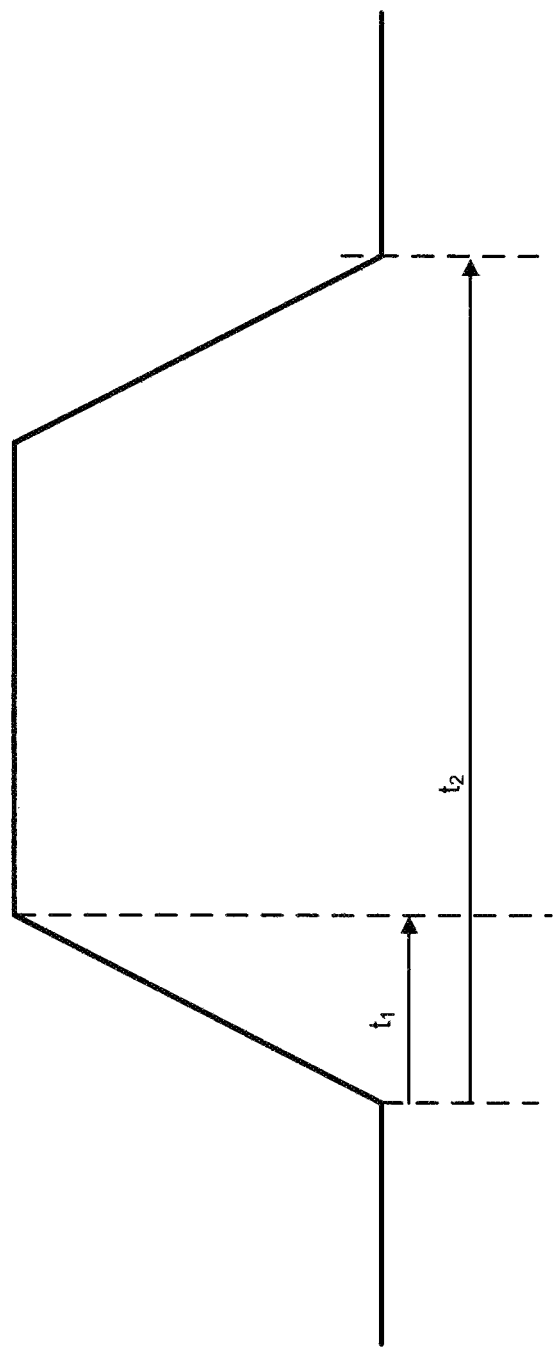
FIG. 2 is an, illustration of an example binary one having a bit period and an edge rate that affects a selection of transistors in the circuit of FIG. 1, according to one embodiment.

FIG. 2 is an example illustration of a desired edge rate and a bit period, providing a basis for selecting relative drive strengths of transistors M0 and M1. Time t1 illustrates the time for a rising edge of a signal corresponding to a binary one at data output node Dout in FIG. 1. Time t2 illustrates the elapsed time for a bit (a bit period). Time t2 is much longer than time t1, thereby illustrating that a drive strength of M1 may be chosen to provide relatively quick discharging of the capacitor C1 to achieve the desired edge rate. However, it may be desirable in some embodiments to charge capacitor C1 over an entire bit period, or even perhaps two bit periods. Accordingly, the drive strength of transistor M0 may be chosen to provide capacitor charging over the time t2 and may therefore have a drive strength lower than that of transistor M1.

Furthermore, the value of capacitor C1 of FIG. 1 may be chosen so that it provides a desired RC constant when transistor M1 is on so as to discharge within the desired edge rate. Also, the value of capacitor C1 may be chosen to provide the desired RC constant when transistor M0 is on so that it charges over a desired period.

Figure 3:
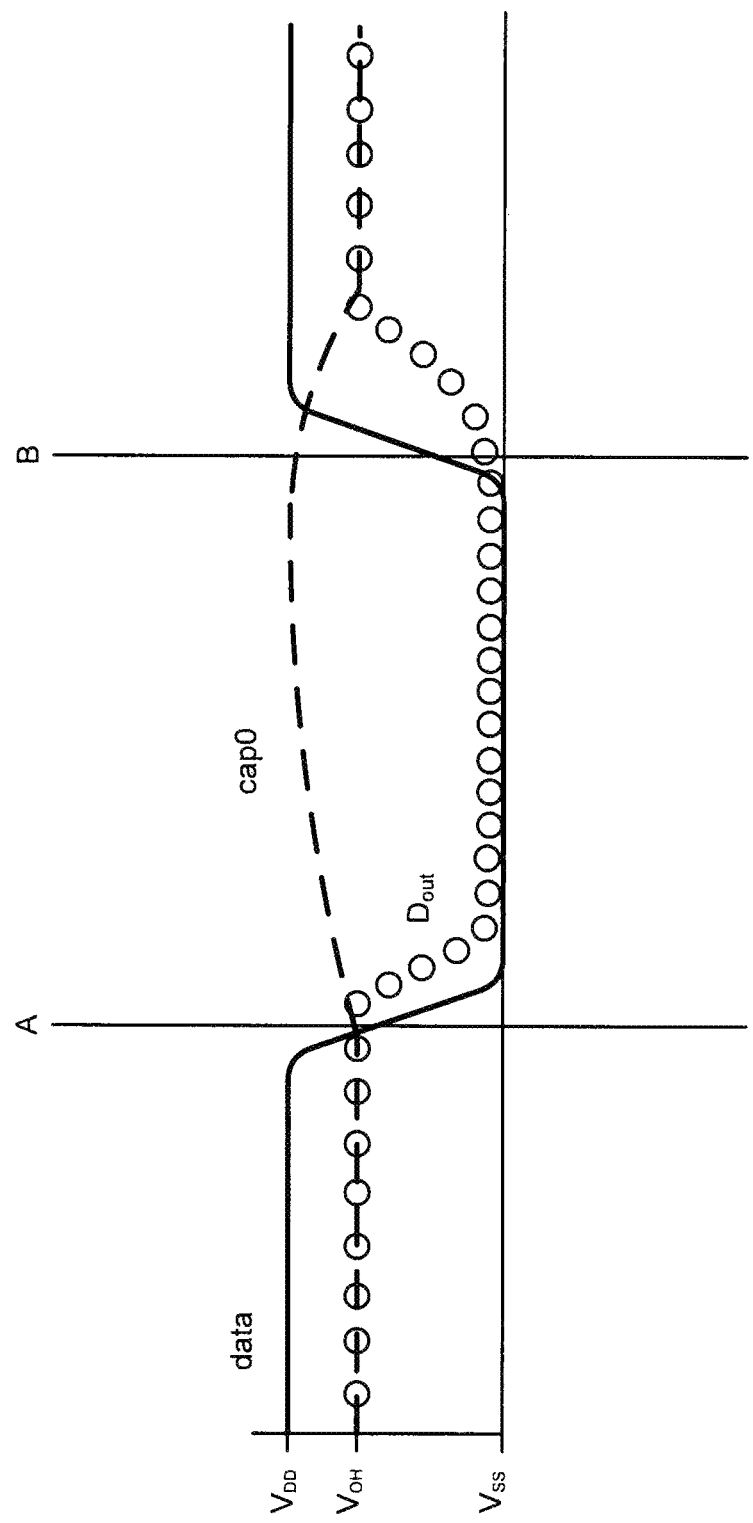
FIG. 3 is a signal diagram of the operation of the circuit of FIG. 1, according to one embodiment.

FIG. 3 is an illustration of signal levels in the transmission buffer circuit 100 and FIG. 1, according to one embodiment. In FIG. 3, the X axis represents time, and the y-axis represents voltage levels, with VSS or ground being a low voltage level, VDD being a high voltage level, and VOH being a high voltage level at the data output node Dout. The signal labeled "data" represents the voltage level of an example data signal as it is received into the circuit 100. The signal labeled "Dout" represents the voltage level at the data output node Dout. The signal labeled "cap0" represents the voltage level at, the node cap0 in FIG. 1.

Of particular note in FIG. 3 is that the signals data and Dout have different voltage swings. For instance, the data signal swings between VDD and VSS. By contrast, the voltage at Dout swings between VOH and VSS, The voltage level at Dout is slightly delayed from the signal data as it is received into the circuit 100, which is due to delay caused by the logic gates and by time to charge and discharge capacitor C1.

The signal cap0 swings between VOH and VDD. It illustrates that capacitor C1 is charged when the data signal is low (a binary zero) and discharges when the data signal turns high. For instance, at time A, the data signal is in its falling edge, thereby causing transistor M0 to turn on and transistor M1 to turn off. As a result, the capacitor C1 begins to charge shortly thereafter, and the voltage at node cap0 rises. At time A the voltage at Dout is VOH, and the voltage Dout begins to fall as transistor M3 turns on.

At time B, the data signal is in its rising edge, thereby turning M1 on and turning M0 off. Also, transistor M3 is turned off. As a result, the capacitor C1 is discharged, as illustrated by the reduction in voltage at node cap0 and the increase in voltage at node Dout. The waveform of FIG. 3 is shown as a very short portion of an alternating waveform. However, in various embodiments, the waveform of FIG. 3 would repeat with various patterns of binary one signals and binary zero signals, which may include multiple binary zero signals in a row and or multiple binary one signals in a row.

Figure 4:
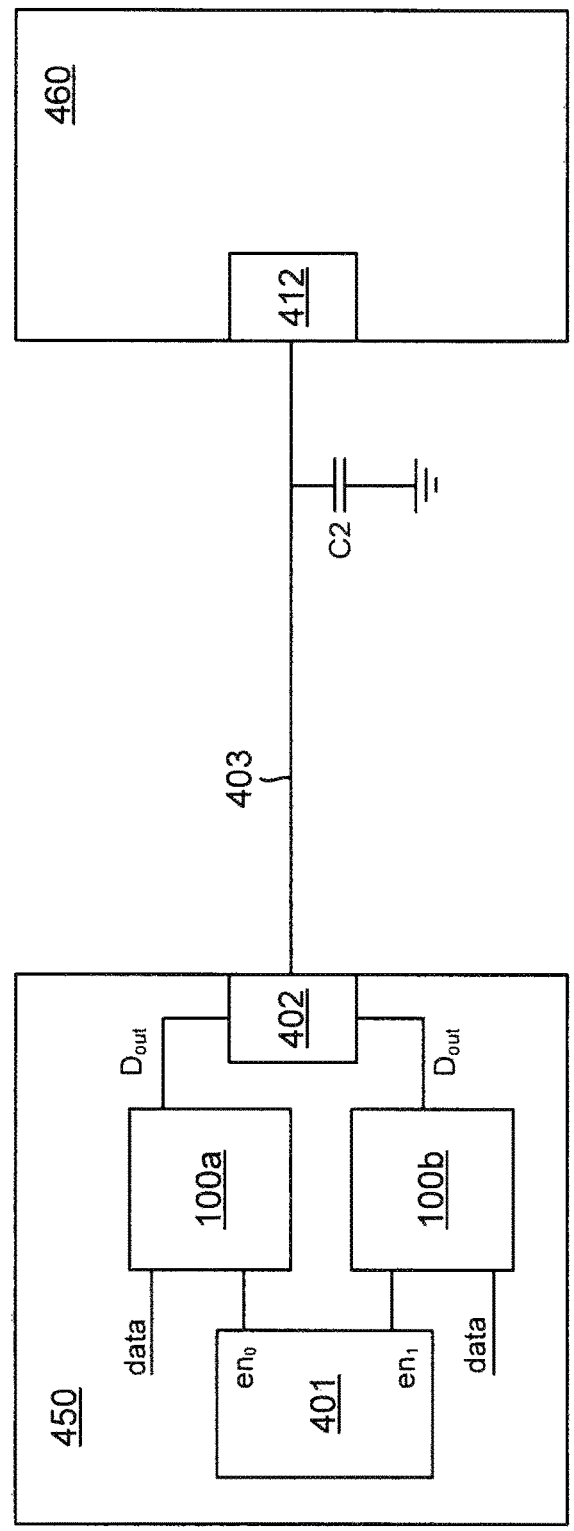
FIG. 4 is an illustration of an example chip having multiple transmit buffer circuits that are independently selectable, adapted according to one embodiment.

FIG. 4 provides an example of how the transmit buffer circuit 100 of FIG. 1 may be applied to transmit a data signal from one chip 450 to another chip 460, Chip 450 is coupled to chip 460 using transmission line 403. Transmission line 403 includes parasitic capacitance C2, where C2 is the same as the parasitic capacitance mentioned above with respect to Equation 1. Transmission line 403 is in electrical communication with the data, pad 402 at Chip 450 and with data pad 412 at Chip 460.

The system of FIG. 4 provides multiple transmit buffer circuits 100 in order to provide a tunable value for C1. Therefore in this example there are two of the transmit buffer circuits of FIG. 1, labeled 100a and 100b coupled in parallel to data pad 402. In this example, the total value of C1 in Equation 1 is the sum of the values for capacitors C1 in the individual transmit buffer circuits 100a and 100b. Each of the individual transmit buffer circuits 100a and 1001a receives the input data signal (data).

Two transmit buffer circuits 100 are shown in this example for ease of illustration, and it is understood that various embodiments may include any appropriate number of circuits 100 in order to provide a range of tunability for the total value of C1. Register 401 includes a string of bits, and the outputs of register 401 go to the enable signals (en) of the transmit buffer circuits 100, thereby allowing either of the circuits 100a and 100b to be turned on or off independently according to a respective bit at register 401, Therefore, a total value for C1 may be chosen to provide a ratio of C1 and C2 and an appropriate level for VOH. This may be done during manufacture, during testing, or at some other time. Also, since the voltage drop across diode 1 (FIG. 1) equals approximately VDD–VOH, various embodiments may provide for multiple selectable diodes as well to match a diode with inappropriate voltage drop.

In one example, a calibration process is performed during manufacture of a package including both chip 450 and chip 460. The calibration process includes holding the value of the data signal high while selecting ones of the circuits 100 and measuring the voltage level at Dout. The process may start off by selecting one of the circuits 100 and leaving the other turned off and measuring the voltage level at Dout. This is followed by selecting two of the circuits 100 and measuring the voltage level at Dout.

In some examples, there may be eight or more circuits 100 that are independently selectable. Accordingly, the calibration process may include iteratively selecting an increasing number of the circuits 100 and measuring respective values for the voltage level at Dout. The observed levels at Dout may be compared to a desired level for Dout, and a number of selectable circuits 100 corresponding to the desired level for Dout is then programmed into register 401. In some instances, calibration may be performed by an external computer (not shown).

Figure 5:
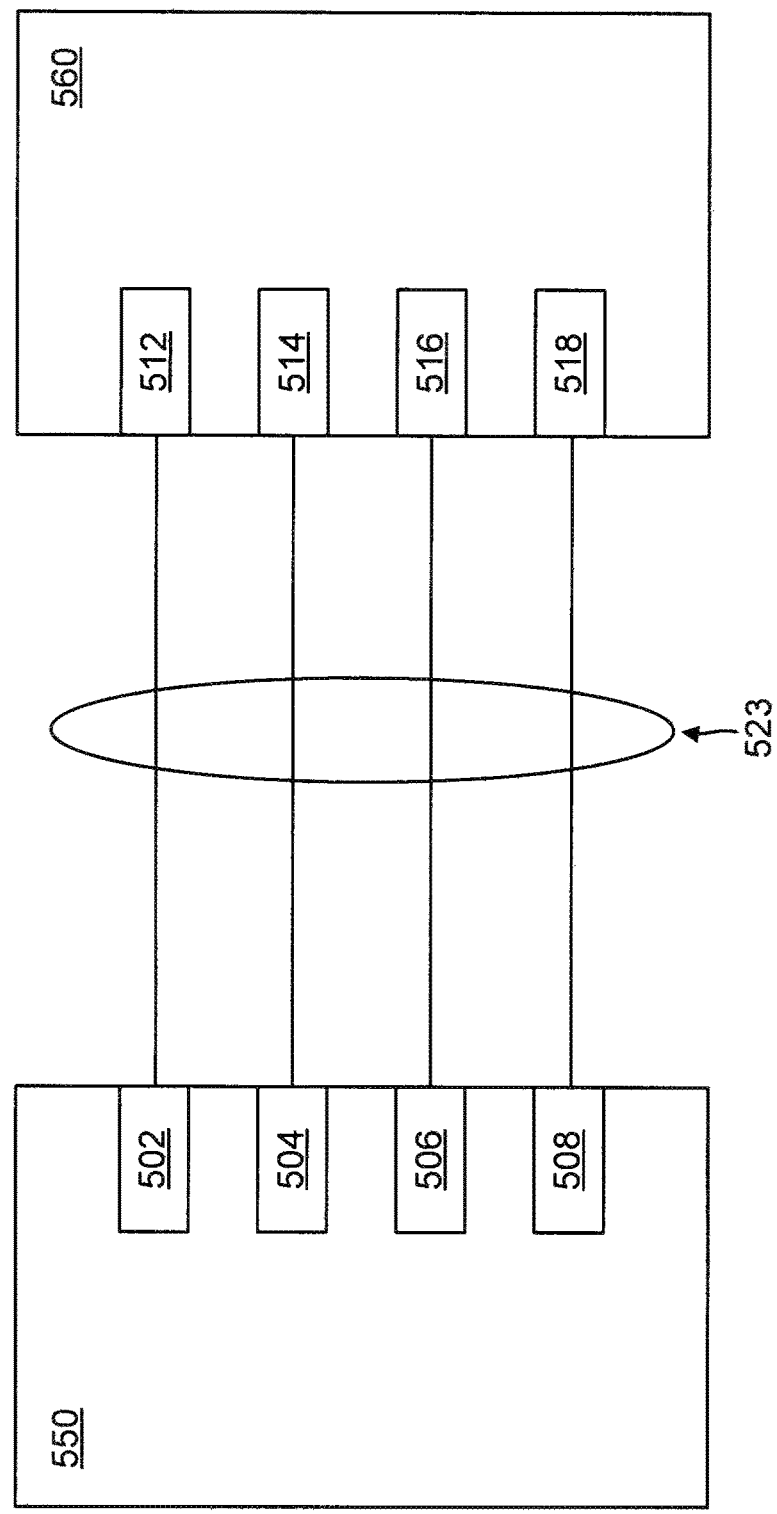
FIG. 5 is an illustration of an example die-to-die interface, according to one embodiment.

Once register 401 is programmed, its bits are provided respectively to circuits 100. Chip 450 therefore applies an appropriate number of circuits 100 as it operates. The calibration process in this example may provide compensation for process variation of the various circuit components and the transmission line 403. Other embodiments may include performing calibration during operation of chip 450, thereby compensating for voltage and temperature variation as well. Additionally, various embodiments may allow a selection of a number of circuits 100 to change the value of VOH, FIG. 5 is an illustration of an example die-to-die interface, according to one embodiment. Chips 550 and 560 are electrically coupled to each other by transmission lines 523. Each transmission line corresponds to a bit of data that is transmitted from chip 550 to chip 560.

Chip 550 includes transmitting circuits 502-508. Taking transmitting circuit 502 as an example, it includes multiple transmit data buffers, such as transmit data buffers 100. For example, as in the embodiment of FIG. 4, transmitting circuit 502 may include two, eight, or any other appropriate number of parallel transmit data buffers 100 so as to provide an appropriate level for VOH. Transmitting circuits 504-508 are similar to transmitting circuit 502 in this regard.

Accordingly, in the example of FIG. 5, each bit of data is associated with a respective transmitting circuit 502-508 that is adjustable as to a number of buffer circuits 100 each having a capacitor. Chip 560 includes receiving circuits 512-518, which capture the bits as they are transmitted across the die-to-die interface.

The example of FIG. 5 shows the number of bits being four. However, the scope of embodiments is not limited to four bits, as any appropriate number of bits and transmit circuits may be used. Furthermore, while the example of FIG. 5 focuses on unidirectional transmission, other embodiments may include sending data from chip 560 to chip 550 and using appropriate transmitting circuits on chip 560 to do so.

Various embodiments may provide one or more advantages over conventional techniques. For instance, various conventional techniques transmit data bits over the die-to-die interface using a large voltage swing, such as a full value of VDD. However, the embodiments described above use capacitive charge sharing to provide a voltage swing equal to VOH, which is smaller than VDD, thereby using less power in the die-to-die interface. Also, the embodiments described above with respect to FIGS. 4 and 5 may allow for compensating for process, temperature, and voltage variation as well as allowing for dynamically changing the value of VOH.

Figure 6:
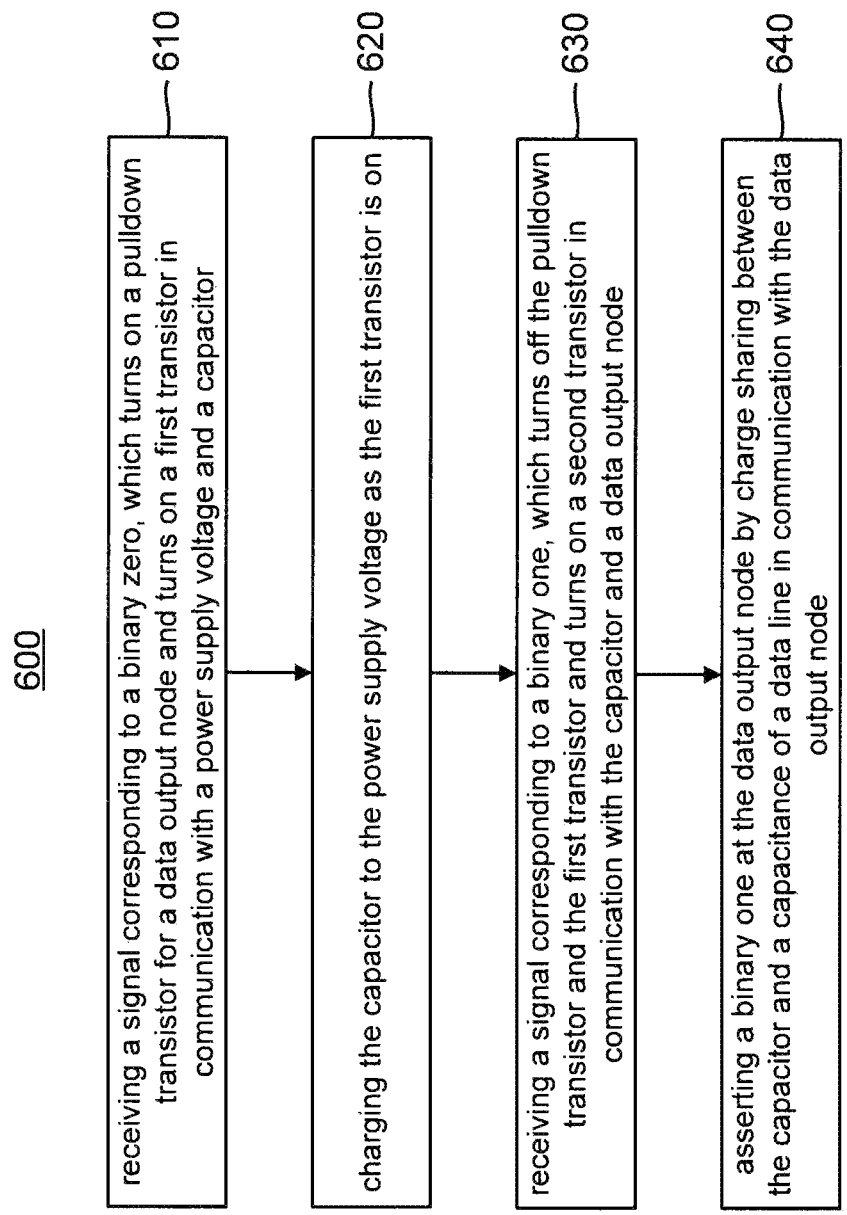
FIG. 6 is an illustration of a flow diagram of an example method of asserting data at a transmission line using charge sharing, according to one embodiment.

A flow diagram of an example method 600 of outputting data on a die-to-die interface is illustrated in FIG. 6. In one example, method 600 is performed by the transmit buffer circuit 100 of FIG. 1. Method 600 may be performed during normal operation of a chip that is transmitting data across the transmission line to another chip.

At action 610, the transmit buffer circuit 100 receives a signal corresponding to a binary zero as a data input. The received signal corresponding to a binary zero turns on a pulldown transistor (e.g., transistor M3) for a data output node. The received signal corresponding to a binary zero also turns on a first transistor (e.g., transistor M0) in communication with the power supply voltage and a capacitor. As a result, the data output node goes to a low voltage, such as VSS or ground. Accordingly, the transmit buffer circuit outputs a signal corresponding to a binary zero onto the transmission line.

At action 620, the circuit charges the capacitor to the power supply voltage as the first transistor is on. For example, in FIG. 1, capacitor C1 is charged up to the power supply voltage VDD when transistor M0 is on. The value of the data input signal turns the first transistor on and off, thereby charging the capacitor C1 when the first transistor is on and not charging the capacitor C1 when the first transistor is off.

At action 630, the circuit receives a signal corresponding to a binary one as a data input. In this example, the received signal corresponding to a binary one may be at a high voltage level that is equal to VDD. The received input signal corresponding, to a binary one turns off the pulldown transistor, thereby not coupling the data output node to a low voltage. The received input signal corresponding to a binary one also turns off the transistor that charges the capacitor, thereby isolating the data output node from VDD.

Additionally at action 630, the received input signal corresponding to a binary one turns on a second transistor (e.g., transistor M1 of FIG. 1) in communication with the capacitor and the data output node. As a result, the capacitor is in communication with the data output node.

At action 640, the circuit asserts a binary one at the data output node by charge sharing between the capacitor and a capacitance of the data transmission line that is in communication with the data output node. An example of the data output node is Dout in FIG. 1, and an example of a data transmission line includes the transmission line 403 of FIG. 4. An, example of a capacitance of the data line is parasitic capacitance, which is illustrated as C2 in FIG. 4. As noted above, the ratio of the value of the capacitor to the value of the data line capacitance affects the value of VOH, according to Equation 1 above.

The scope of embodiments is not limited to the specific method shown in FIG. 6. Other embodiments may add, omit, rearrange, or modify one or more actions. For instance, method 600 may be performed multiple times as the chip operates, and not necessarily in an alternating pattern of ones and zeros. For instance, the system may transmit multiple ones in multiple zeros in a row. In instances when the circuit transmits multiple binary one signals in a row, method 600 may further include charging the capacitor via a diode in communication with a power rail should the voltage at the data output node dip below VOH.

Furthermore, other embodiments may also include selecting a number of data transmit buffers, each having its own capacitor, to achieve a desired VOH. An example is described above with respect to FIG. 4, Also, method 600 may be performed at each bit independently.

As those of some skill in this art will by now appreciate and depending on, the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A circuit comprising:
a data input in communication with a first transistor stack;
a first capacitor having a first capacitance and in communication with a power supply via a first transistor of the first transistor stack, wherein the first transistor is configured to charge the first capacitor in response to the data input receiving a signal corresponding to a first binary value;
a data output node coupled between the first transistor stack and a transmission line having a second capacitance; and
wherein a second transistor of the first transistor stack is coupled between the data output node and the first capacitor, further wherein the second transistor is configured to discharge the first capacitor to the data output node in response to the data input receiving a signal corresponding to a second binary value.

2. The circuit of claim 1, wherein the data output node is in communication with ground through a third transistor of the first transistor stack, wherein the third transistor is configured to pull the data output node to ground in response to the data input receiving the signal corresponding to the first binary value.

3. The circuit of claim 1, wherein the second transistor has a greater drive strength than the first transistor.

4. The circuit of claim 1, wherein the first binary value is a binary zero, and wherein the second binary value is a binary one.

5. The circuit of claim 1, further comprising a diode disposed between the power supply and the first capacitor.

6. The circuit of claim 5, wherein a voltage drop of the diode corresponds to a difference between an output high voltage at the data output node and a voltage of the power supply.

7. The circuit of claim 1, wherein a voltage output high (VOH) at the data output node is related to a voltage of the power supply (VDD), the first capacitance (C1), and the second capacitance (C2) as follows:

$$VOH = Vdd*(C1/(C1+C2)).$$

8. The circuit of claim 7, further comprising a second capacitor coupled with a second transistor stack, the second capacitor configured in parallel with the first capacitor and coupled with the data output node;
wherein the first and second transistor stacks are selectable, and further wherein C1 is equal to the first capacitance plus the capacitance of the second capacitor corresponding to both the first transistor stack and the second transistor stack being selected.

9. The circuit of claim 1, wherein the first transistor and second transistor are coupled with an enable signal.

10. A method to output a data signal, the method comprising:
receiving a signal corresponding to a binary zero, and in response to the signal corresponding to the binary zero turning on a pulldown transistor for a data output node and turning on a first transistor coupled between a power supply voltage and a capacitor;
charging the capacitor to the power supply voltage as the first transistor is on;
receiving a signal corresponding to a binary one, and in response to the signal corresponding to the binary one turning off the pulldown transistor and the first transistor and turning on a second transistor coupled between the capacitor and a data output node; and
asserting the binary one at the data output node by charge sharing between the capacitor and a capacitance of a data line coupled with the data output node.

11. The method of claim 10, wherein asserting the binary one of the data output node comprises:
asserting the binary one at a voltage output high (VOH) that is lower than the power supply voltage.

12. The method of claim 10, wherein VOH at the data output node is related to the power supply voltage (VDD), a capacitance of the first capacitor (C1), and the capacitance of the data line (C2) as follows:

$$VOH = Vdd*(C1/(C1+C2)).$$

13. The method of claim 12, further comprising selecting a data transmit buffer having an additional capacitor in parallel with the capacitor and coupled with the data output node;
wherein C1 is equal to the capacitance of the capacitor plus the capacitance of the additional capacitor.

14. The method of claim 10, wherein receiving the binary one comprises:
receiving the binary one at the power supply voltage at a data in node.

15. The method of claim 10, further charging the capacitor via a diode disposed between the capacitor and a power supply while asserting the binary one at the data output node.

16. The method of claim 15, wherein a voltage drop of the diode corresponds to a difference between an output high voltage at the data output node and the power supply voltage.

17. The method of claim 10, wherein the second transistor has a greater drive strength than the first transistor.

18. A data transmitting circuit comprising:
means for coupling a data output node to ground in response to receiving a signal corresponding to a binary zero as a data input;
means for charging a first capacitor to a power supply voltage in response to receiving the signal corresponding to the binary zero as the data input; and
means for discharging the first capacitor at the data output node to achieve a voltage output high at the data output node in response to receiving a signal corresponding to a binary one as the data input, wherein the voltage output high is higher than ground and lower than the power supply voltage.

19. The data transmitting circuit of claim 18, wherein the means for charging the first capacitor comprises a first transistor, and wherein the means for discharging the first capacitor comprises a second transistor, further wherein the second transistor has a greater drive strength than the first transistor.

20. The data transmitting circuit of claim 18, further comprising:
a diode disposed between a power rail and the first capacitor.

21. The data transmitting circuit of claim 20, wherein a voltage drop of the diode corresponds to a difference between the voltage output high and the power supply voltage.

22. The data transmitting circuit of claim 18, wherein the voltage output high (VOH) at the data output node is related to the power supply voltage (VDD), a capacitance of the first capacitor (C1), and the capacitance of the transmission line coupled with the data output node (C2) as follows:

$$VOH = Vdd*(C1/(C1+C2)).$$

23. The data transmitting circuit of claim 22, further comprising a second capacitor in parallel with the first capacitor and coupled with the data output node;
wherein the first and second capacitors are selectable, and further wherein C1 is equal to the first capacitance plus the second capacitance.

24. The data transmitting circuit of claim 22, further comprising a second capacitor in parallel with the first capacitor and coupled with the data output node;
wherein the first and second capacitors are selectable by respective enable circuits, and further wherein C1 is equal to the first capacitance plus the second capacitance corresponding to both the first capacitor and the second capacitor being selected;
the data transmitting circuit further comprising: means for selecting either or both of the first capacitor and the second capacitor.

25. A processing chip comprising:
a plurality of data transmitting circuits, each of the data transmitting circuits in communication with a respective data transmission line, each of the data transmission lines having a respective capacitance;
each of the transmitting circuits comprising:
a first transistor stack configured to couple the data output node to ground in response to receiving a signal corresponding to a binary zero as a data input, further configured to charge a first capacitor to a power supply voltage in response to receiving the signal corresponding to the binary zero as the data input, and further configured to discharge the first capacitor at the data output node to a voltage output high that is lower than the power supply voltage in response to receiving a signal corresponding to a binary one as the data input; and
a second transistor stack configured to couple the data output node to ground in response to receiving the signal corresponding to the binary zero as the data input, further configured to charge a second capacitor to the power supply voltage in response to receiving the signal corresponding to the binary zero as the data input, and further configured for discharging the second capacitor at the data output node to the voltage output high in response to receiving the signal corresponding to the binary one as the data input;
wherein the first transistor stack and second transistor stack are configured to be selected or deselected using respective enable signals.

26. The processing chip of claim 25, wherein the first transistor stack comprises:
a first transistor configured to charge the first capacitor to the power supply voltage; and
a second transistor configured to discharge the first capacitor at the data output node, wherein the second transistor has a greater drive strength than the first transistor.

27. The processing chip of claim 25, wherein the first capacitor is coupled with a power rail via a diode, wherein a voltage drop across the diode corresponds to a difference between the power supply voltage and the voltage output high.

28. The processing chip of claim 25, wherein for each of the transmitting circuits a capacitance sum (C1) is equal to a capacitance of the first capacitor plus a capacitance of the second capacitor corresponding to both the first transistor stack and second transistor stack being selected.

29. The processing chip of claim 28, wherein the voltage output high (VOH) at the data output node is related to the power supply voltage (VDD), C1, and a capacitance of the respective data transmission line (C2) as follows:

$$VOH = Vdd*(C1/(C1+C2)).$$

30. The processing chip of claim 25, further comprising a register coupled with the first transistor stack and the second transistor stack and configured to provide the respective enable signals.

* * * * *